(12) United States Patent
Morris et al.

(10) Patent No.: US 6,377,458 B1
(45) Date of Patent: Apr. 23, 2002

(54) INTEGRATED EMI CONTAINMENT AND SPRAY COOLING MODULE UTILIZING A MAGNETICALLY COUPLED PUMP

(75) Inventors: Terrel L. Morris, Garland; Christian L Belady, McKinney, both of TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/628,924

(22) Filed: Jul. 31, 2000

(51) Int. Cl.[7] .................................................. H05K 7/20
(52) U.S. Cl. ...................... 361/699; 62/259.2; 165/80.4; 165/908; 174/15.1; 257/714; 361/695
(58) Field of Search ........................ 62/259.2; 174/15.1, 174/16.1; 257/714; 361/687–689, 699, 700, 715; 165/80.4, 908

(56) References Cited

U.S. PATENT DOCUMENTS 5,522,452 A * 6/1996 Mizuno et al. ............. 361/699
5,768,103 A * 6/1998 Kobrinetz et al. .......... 361/699
5,785,116 A   7/1998 Wagner ...................... 165/80.3
5,901,037 A * 5/1999 Hamilton et al. ........... 361/699
5,907,473 A * 5/1999 Przilas et al. ............... 361/699
5,943,211 A * 8/1999 Havey et al. ................ 361/699

* cited by examiner

Primary Examiner—Gregory Thompson

(57) ABSTRACT

An assembly comprising an integrated cooling system/liquid containment system/EMI shield/pump housing/heat sink is built atop a multi-chip module. The attached devices are cooled by a spray of fluid, effecting a phase change from liquid to gas at the point of evaporation. Condensing liquid accumulates at the base of the fins and is collected by a pump for redistribution. The pump is coupled to a fan blade, which in turn is operated by a motor. A seal is formed between the multi-chip module and the integrated housing. The assembly is designed such that this seal need not be broken to service the motor, thus minimizing the amount of vapors from the working fluid lost into the atmosphere. Case fins and fan blades are arranged for improved efficiency.

5 Claims, 4 Drawing Sheets

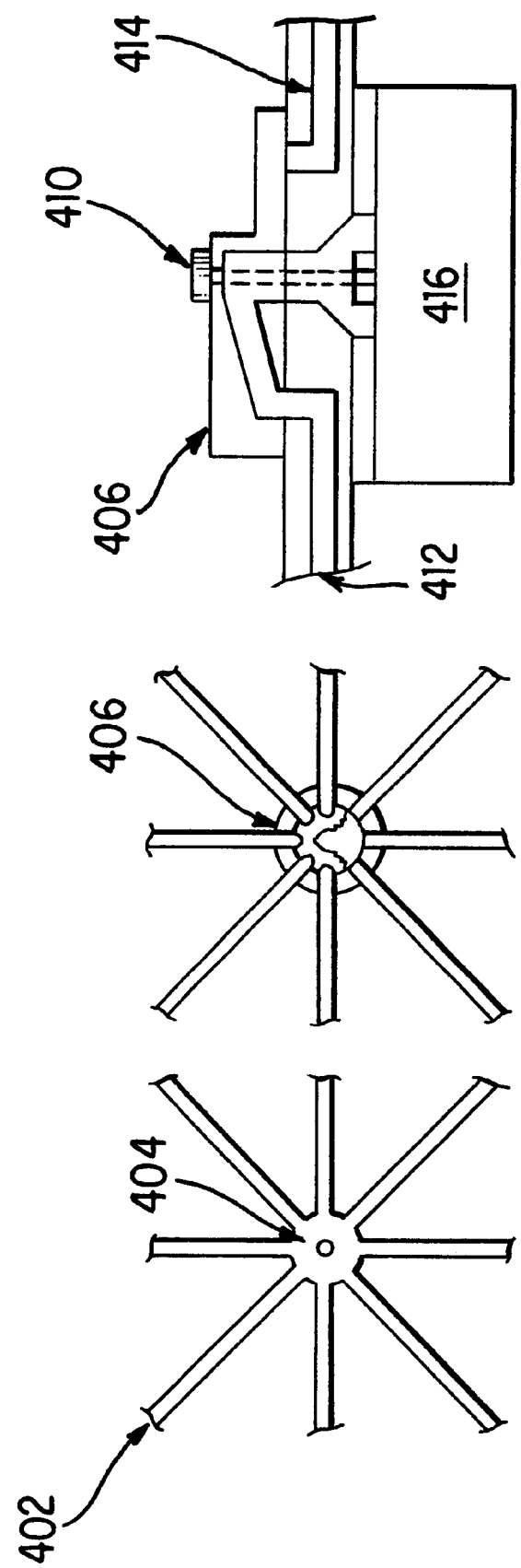

INTEGRATED EMI CONTAINMENT AND SPRAY COOLING MODULE UTILIZING A MAGNETICALLY COUPLED PUMP

FIELD OF THE INVENTION

This invention relates generally to the filed of integrated circuit packaging and more specifically to the field of heat dissipation in integrated circuit packaging.

BACKGROUND OF THE INVENTION

Many electronic devices, particularly high performance devices, generate large amounts of heat as a by-product of their operation. In particular, high speed integrated circuits generate large amounts of heat in a very small area. Since the performance of integrated circuits is degraded at higher temperatures, and their reliability is similarly degraded, much effort has been expended in the field of heat dissipation in integrated circuit packaging.

Current approaches to this problem include heat sinks or heat sink/fan combinations (where the fan blows cooler air across the heat sink), liquid immersion cooling, and spray cooling printed circuit board (PCB) assemblies. Heat sinks require a thermally conductive path from the integrated circuit die to the heat sink. This thermally conductive path generally has a relatively large inherent thermal resistance, and thus limits the amount of heat that can be dissipated from the device. When a heat sink is used to dissipate energy from several devices, the devices are often not precisely co-planar, and a compensating mechanism is required to match a single planar heat removal path to multiple devices. Even very small gaps drastically increase the thermal resistance of the path from the device to the heat sink. Also, heat sinks suffer losses due to poor fin efficiency; i.e. the thermal resistance associated with the tall, narrow form factor of many heat sink fins. This limits the amount of heat that can be removed from the devices, and becomes more significant as airflow over the heat sink is increased.

When devices are immersed in a liquid coolant, completely covering the device, direct heat transfer occurs from the device to the fluid. This fluid is then generally pumped to a heat exchanger and cooled. As a result of this design, a large volume of expensive fluid (typically 3M Fluorinert™) is required. In liquid cooling, as the name suggests, no phase change occurs at the integrated circuit, so heat removal is not as effective as in techniques that utilize a phase change of the liquid coolant. Flow paths and flow rates of the liquid coolant must be carefully controlled to avoid hot spots. Also, in a computer system, large numbers of connections in piping, pumps and heat exchangers create multiple opportunities for leaks, the subsequent loss of fluid, and the subsequent loss of cooling efficiency. Electrical pumps are generally required to circulate the fluid, and are subject to failure of the motors and seals. Pump replacement generally requires draining the system and exposing the fluid path to the atmosphere. Also, the device sub-assembly must be removed from the liquid cooling system prior to any replacement or repair activity. This operation requires draining the fluid, and creates more opportunities for leaks, spillage and evaporation. This process increases system downtime. In addition, opening the liquid cooling system to the atmosphere may allow vapor to escape into the atmosphere, which may contribute to global warming or depletion of the ozone layer.

While direct spray cooling of devices on PCB assemblies adds the advantage of a phase change at the point of cooling, there are several disadvantages in a typical installation. Chemical interactions between the working fluid and the circuit board materials, solder flux residues, solder dross residues, plastic integrated circuit packages, rubber or plastic seals, and air require that every combination be chemically analyzed and tested for long-term stability. This requirement adds direct cost and increases time to market for each combination of materials. Failure to correctly assess each combination of materials can result in reliability degradation. In addition, external heat exchangers, plumbing, and pumps add cost. Multiple connections within the system create many opportunities for leaks, and the subsequent release of vapors into the atmosphere. Constant re-circulation of the working fluid across a large surface allows solder debris and other impurities to become a problem. Filters can trap the large particles, however small solids and precipitates in suspension can re-locate on the PCB assembly to form localized high-resistance shorts. Also, constant re-circulation of a particle-laden working fluid can prematurely wear down pump components to the point of pump failure. PCB materials may eventually become permeated with the working fluid, and leak small amounts of the fluid into the atmosphere. Additional fluid must be provided in the assembly to compensate for this fluid lost to low-level leakage over time. Also, the system's electrical reliability may be compromised if the volume of the working fluid drops below a specific point.

Liquid cooling and normal spray cooling approaches to the power dissipation problem typically are high cost solutions and of high complexity as a result of discrete pumps, piping, and condenser units. A low-cost, small form factor alternative to liquid cooling and normal spray cooling systems, while still maintaining the benefits of a phase change is needed in the art. Also, since liquid cooling and normal spray cooling systems typically require the opening of a sealed liquid unit during servicing, a system where the pump can be replaced without unsealing the liquid portion of the system is needed in the art. As concerns over the release of vapors into the atmosphere and global warming increase, there is an additional need for cooling systems that minimize working fluid leakage possibilities both during normal usage and servicing.

Heat sinks and heat sink/fan combinations often are inadequate in a high thermal load environment due to losses from interface resistance. Thus, there is a need for a high performance, compact heat dissipation system.

SUMMARY OF THE INVENTION

An assembly comprising an integrated cooling system/liquid containment system/EMI shield/pump housing/heat sink is built atop a multi-chip module. The attached devices are cooled by a spray of fluid, effecting a phase change from liquid to gas at the point of evaporation. Condensing liquid accumulates at the base of the fins and is collected by a pump for redistribution. The pump is coupled to a fan blade, which in turn is operated by a motor. A seal is formed between the multi-chip module and the integrated housing. The assembly is designed such that this seal need not be broken to service the motor, thus minimizing the amount of vapors from the working fluid lost into the atmosphere. Case fins and fan blades may be arranged in a Turbocooler (Wagner, U.S. Pat. No. 5,785,116) configuration for improved efficiency.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 4A and FIG. 4B are cross-section bottom views of a selector valve.

FIG. 4C is a cross-section side view of a selector valve.

DETAILED DESCRIPTION

Figure 1:
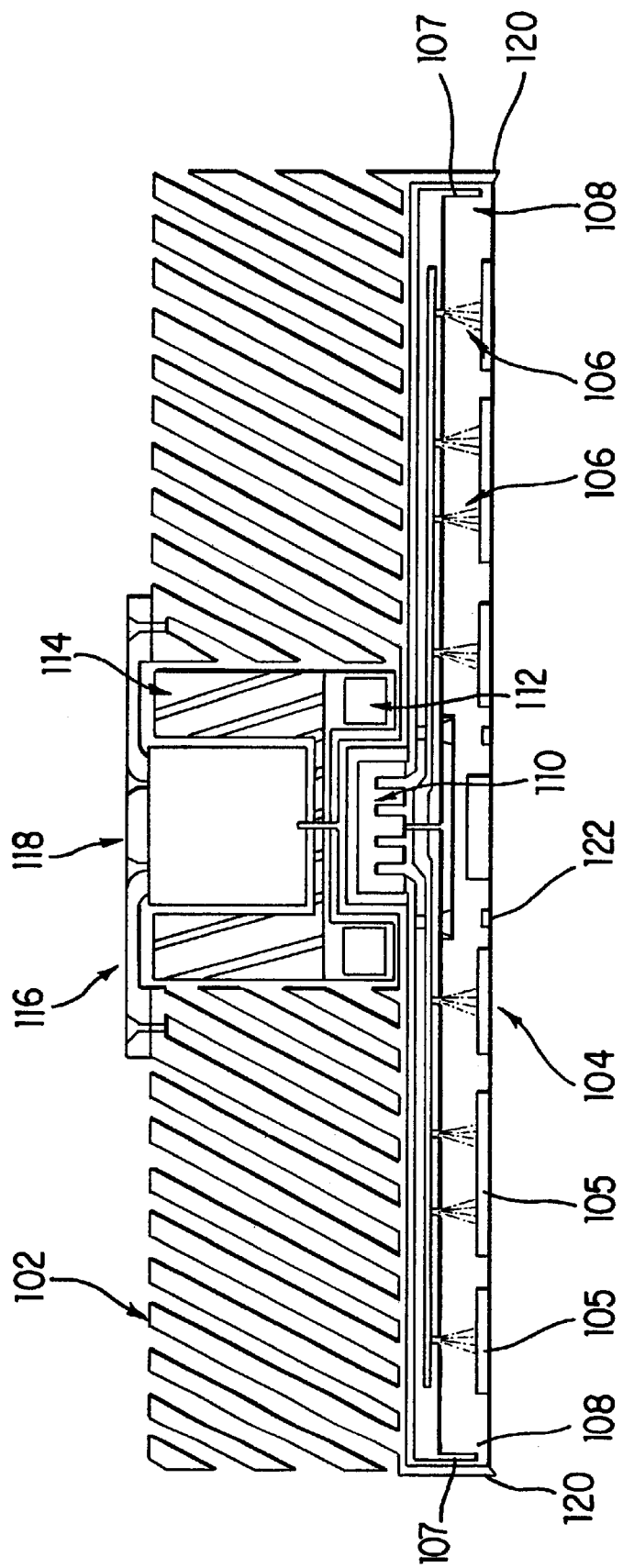
FIG. 1 is a cross-section side view of an embodiment of an assembly incorporating an integrated EMI containment and spray cooling module utilizing a magnetically coupled pump.

FIG. 1 is a cross-section side view of an embodiment of an assembly incorporating an integrated EMI containment and spray cooling module utilizing a magnetically coupled pump. The integrated housing element 102 sits atop a multi-chip module 104, whose attached electronic devices 105 are cooled by a spray 106 of fluid, effecting a phase change from liquid to gas at the point of evaporation. An example suitable fluid is Fluorinert™ available from Minnesota Mining and Manufacturing Co. (3M). Condensing liquid begins to accumulate at the base of the fins 107, or elsewhere as discussed in conjunction with FIG. 4A and FIG. 4B, and returns to points 108, where it is collected by a pump 110 for redistribution. Pump 110 is magnetically coupled at interface 112 to fan blade 114, which in turn is operated by motor 118 supported by bracket 116. A seal 120 is formed between the multi-chip module 104 and the integrated housing 102. Case fins and fan blades 114 are arranged for improved efficiency.

Figure 2:
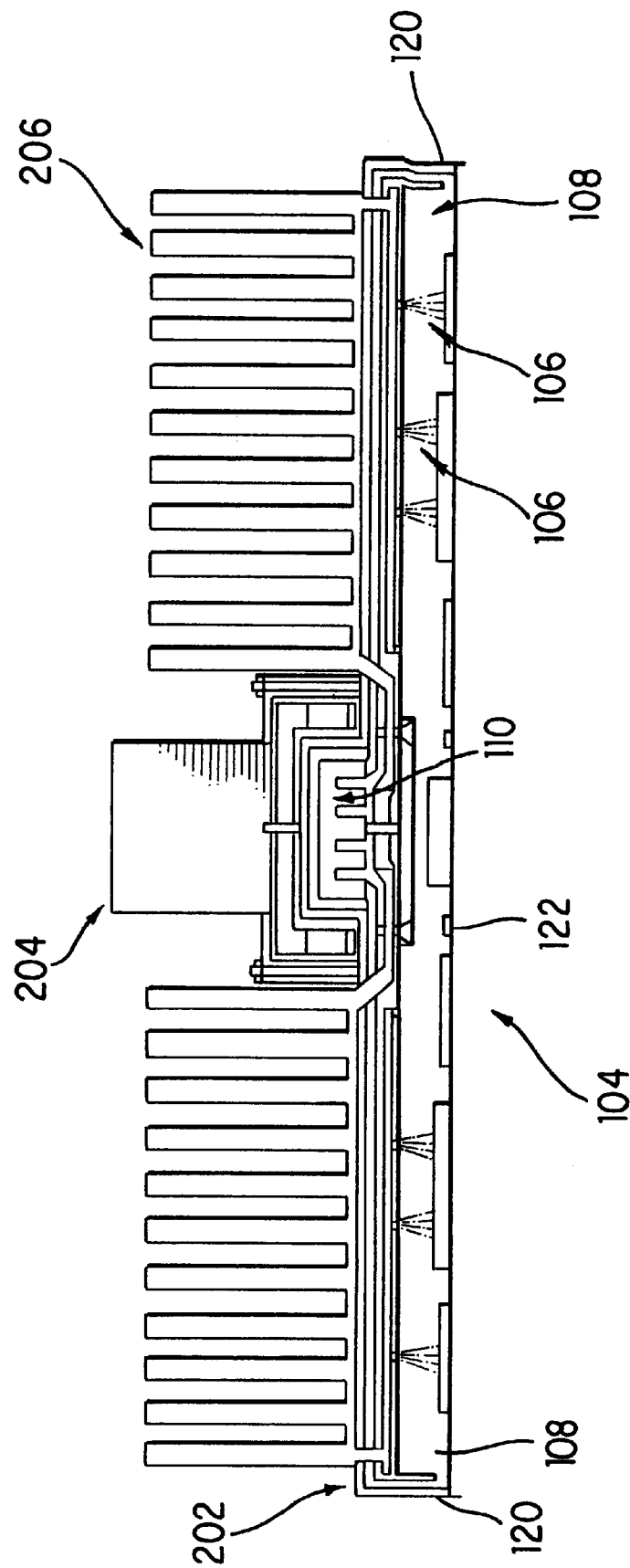
FIG. 2 is a cross-section side view of another embodiment of an assembly incorporating an integrated EMI containment and spray cooling module utilizing a magnetically coupled pump.

FIG. 2 is a cross-section side view of another embodiment of an assembly incorporating an integrated EMI containment and spray cooling module utilizing a magnetically coupled pump within a traditional fan-forced airflow system. In this embodiment of the present invention, the liquid path flows through the fins, eliminating fin loss and improving heat transfer from the liquid to system airflow. A folded-fin design can be used in this embodiment, resulting in very thin fin walls and excellent fin efficiency. In FIG. 2, the integrated housing element 202 sits atop a multi-chip module 104, whose attached integrated circuit die are cooled by a spray 106 of fluid, effecting a phase change from liquid to gas at the point of evaporation. Condensing liquid/gas mixture returns to points 108, where it is collected by a pump 110 for redistribution. The pump 110 is magnetically coupled to a pump motor 204. Liquid/gas filled fins 206 may cool the working fluid after it is pumped, but before it is sprayed. A seal 120 is formed between the multi-chip module 104 and the integrated housing 202. In these types of embodiments, the vapor phase of the fluid may condense to the liquid phase within the volume enclosed by the fins. This volume enclosed by the fins is part of the integrated housing element 202 and is sealed from the atmosphere.

Figure 3:
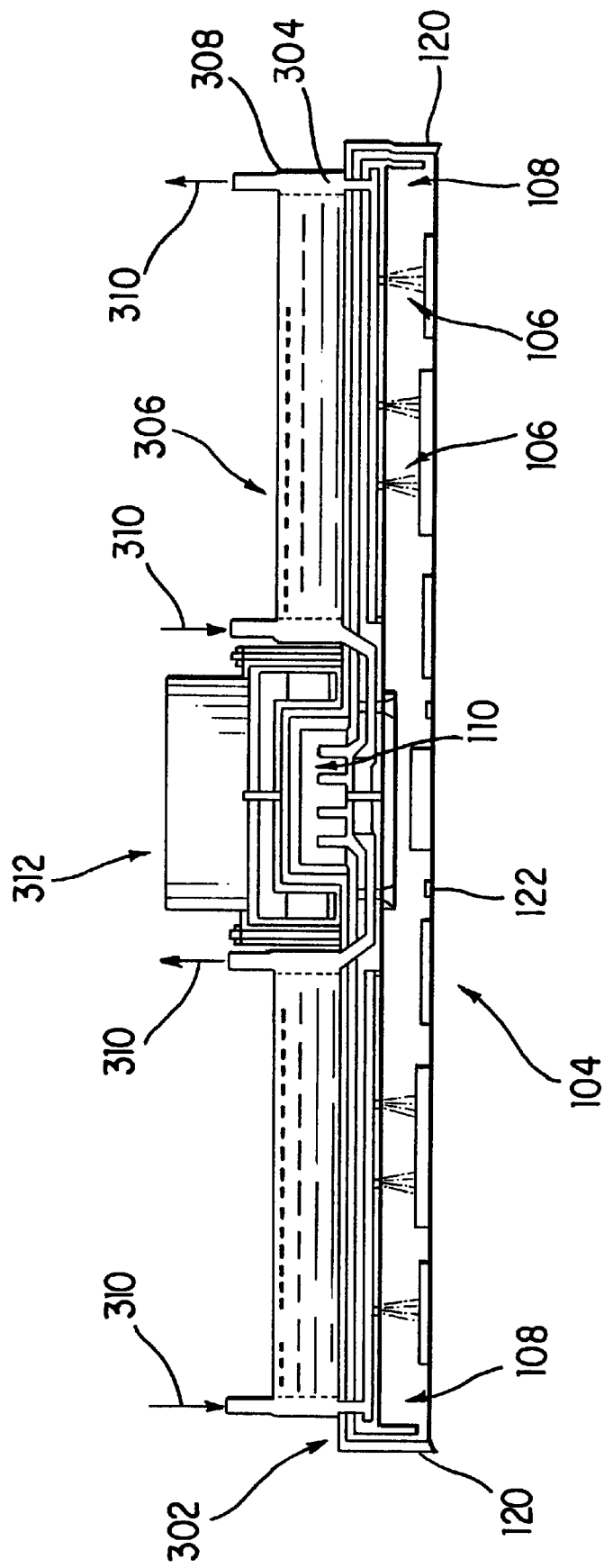
FIG. 3 is a cross-section side view of another embodiment of an assembly incorporating an integrated EMI containment and spray cooling module utilizing a magnetically coupled pump.

FIG. 3 is a cross-section side view of another embodiment of an assembly incorporating an integrated EMI containment and spray cooling module utilizing a magnetically coupled pump for use within a cabinet comprising a liquid cooled system. This embodiment of the present invention is suitable for use in a cabinet comprising a liquid cooled system, or spray refrigeration cooled system. A heat exchanger 306 is placed between the inert working fluid and the cabinet cooling fluid. As in the embodiment shown in FIG. 2, this embodiment employs liquid-filled fins 304 as part of the heat exchanger design. In FIG. 3, the integrated housing element 302 sits atop a multi-chip module 104, whose attached electronic devices are cooled by a spray 106 of fluid, effecting a phase change from liquid to gas at the point of evaporation. Condensing liquid/gas mixture returns to points 108, where it is collected by pump 110 for redistribution. The pump 110 is magnetically coupled to a pump motor 312. Liquid/gas filled fins 308 within the heat exchanger 306 transfer heat to the secondary cooling liquid, which is pumped through the module. The inlets and outlets 310 of the heat exchanger 306 are connected to a liquid cooling system. A seal 120 is formed between the multi-chip module 104 and the integrated housing 302.

The embodiments described above, and other possible embodiments of this invention, can be temperature controlled by means of varying the combined fan/pump speed as dictated by thermal sensors 122 within the module.

Also, these embodiments can be made with a ceramic/glass multi-chip module substrate, forming a hermetically sealed, chemically inert unit that never has to be opened for service. Thus, the pump motor/fan unit can be replaced without breaking the liquid seal. Alternatively, embodiments of this invention can be made with an epoxy/glass, teflon, or other multi-chip module substrate, forming a sealed unit that never has to be opened for service. Additional fluid may need to be inserted at the time of manufacture to replace the small amount lost due to outgassing through the substrate. Once again, the pump/fan unit can be replaced without breaking the liquid seal.

Embodiments of this invention can be made to operate with a negative pressure, such that any leaks which occur would bring in outside air rather than leaking the working fluid or gas to the atmosphere. At some amount of leakage, performance would be compromised, and the temperature sensors would indicate an over-temperature condition. These embodiments may never have to be opened for service and the pump/fan unit can be replaced without breaking the liquid seal.

Those skilled in the art will recognize that "recipes" can be created for all of the materials enclosed in the housing of embodiments of this invention, such that any design built with those materials will be automatically qualified for spray cooling. This technique may eliminate the need to qualify material used in each design for compatibility with other materials and the working fluid.

Other embodiments of the present invention may be built to cool a single device rather than the multi-chip module described above. Also, those skilled in the art will recognize that the size and position of the spray modules may be optimized for maximum spray performance in any given module design.

FIG. 4A and FIG. 4B are cross-section bottom view of a selector valve. FIG. 4C is a cross-section side view of a selector valve. This selector valve is an alternative embodiment of the present invention. It ensures that liquid is pumped regardless of the orientation of the assembly relative to gravity. In some embodiments, a selector valve may not be needed, and a liquid/gas mix would be pumped rather than a liquid. In FIG. 4A, a total of eight liquid return lines 402 are shown, although other quantities could be used within the scope of the present invention. FIG. 4A shows a central collection point 404 as seen looking up into the integrated cooling system/liquid containment system/EMI shield/pump housing as described above. Note that the angled lines come from each of the four corners of the assembly, and that the orthogonal lines come from the center of each of the four sides. In FIG. 4B, a gravity-operated valve 406 is shown. In this embodiment the gravity-operated valve 406 rotates to close off all ports except the three that are associated with the lowest side of the assembly. If the assembly is rotated relative to gravity, then the valve will rotate accordingly and open different ports. If the assembly is horizontal, then any of the eight ports will work and the position of the valve is not relevant. FIG. 4C shows the gravity-operated valve 406, rotating about pin 410. A liquid port 412 has been connected to pump 416 by the gravity-operated valve 406, while another liquid port 414 has been blocked. Valve sealing between the valve face and pump housing can be obtained by a variety of standard means, including, but not limited to, plastic seals, concentric rings of ridges on the valve side and grooves on the pump side (or vice versa), and the design of the pump flow and valve restrictions such that the valve is pulled toward the pump face during operation.

By sealing the working fluid enclosure in such a manor that the pump motor may be replaced without opening the sealed enclosure, expensive (and possible damaging) vapors from the working fluid are not exposed to the atmosphere during normal use and servicing. The electronic devices are spray cooled in a module that fits easily into many hardware configurations and may use fans and heat exchangers to further improve cooling efficiency. In summary, this invention allows the thermal cooling of electronic devices in a compact, efficient, and easily serviceable configuration.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention insofar as limited by the prior art.

What is claimed is:

1. An assembly comprising:
    a housing element having at least one nozzle;
    a circuit module having at least one electronic device attached with said housing element forming a sealed enclosure;
    a motor mechanically coupled with said housing element;
    a pump magnetically coupled with said motor; and
    a fluid contained within said enclosure circulating through said at least one housing element nozzle, spray cooling said at least one electronic device;
    wherein said pump circulates said fluid.

2. An assembly comprising:
    a housing element having at least one nozzle;
    a circuit module having at least one electronic device attached with said housing element forming a sealed enclosure;
    a motor mechanically coupled with said housing element;
    a pump coupled with said motor;
    a fan, including a fan blade coupled with said motor;
    fins attached with said housing element, wherein said fins receive airflow from said fan; and
    a fluid contained within said enclosure circulating through said at least one housing element nozzle, spray cooling said at least one electronic device;
    wherein said pump circulates said fluid.

3. The assembly recited in claim 2, further comprising:
    at least two liquid ports through which said fluid circulates; and
    a selector valve connected with said pump wherein said selector valve closes at least one liquid port while opening at least one different liquid port.

4. The assembly recited in claim 3, wherein said open liquid port is determined by gravity.

5. The assembly recited in claim 3, further comprising:
    at least one thermal sensor, wherein said thermal sensor controls a speed of said motor.

* * * * *